United States Patent [19]
Schulte et al.

[11] Patent Number: 5,726,592
[45] Date of Patent: Mar. 10, 1998

[54] SELF BIASED LOW-VOLTAGE DIFFERENTIAL SIGNAL DETECTOR

[75] Inventors: Donald Joseph Schulte, Eagan; James David Strom, Rochester, both of Minn.

[73] Assignee: International Business Machines Corporation, Armonk, N.Y.

[21] Appl. No.: 572,886

[22] Filed: Dec. 18, 1995

[51] Int. Cl.$^6$ ...................................................... H03K 5/22
[52] U.S. Cl. ................... 327/65; 327/77; 327/66
[58] Field of Search ..................... 330/253, 258, 330/311; 327/65, 66, 67, 52, 53, 54, 55, 77, 403, 404, 405, 63

[56] References Cited

U.S. PATENT DOCUMENTS

| | | | |
|---|---|---|---|
| 4,555,673 | 11/1985 | Huijsing et al. | 330/258 |
| 4,766,394 | 8/1988 | Yukawa | 330/253 |
| 4,797,631 | 1/1989 | Hsu et al. | 330/253 |
| 5,142,244 | 8/1992 | Glicia et al. | 330/253 |
| 5,208,552 | 5/1993 | Ryat | 330/253 |
| 5,280,199 | 1/1994 | Itakura | 330/253 |
| 5,287,071 | 2/1994 | Olmstead et al. | 330/258 |
| 5,337,008 | 8/1994 | Badyal | 330/253 |
| 5,371,474 | 12/1994 | Wassenaar et al. | 330/253 |

OTHER PUBLICATIONS

WP 3.7: A CMOS Low–Voltage–Swing Transmission-Line Transceiver; Bill Gunning, Leo Yuen, Trung Nguyen, Tony Wong, 1992 IEEE International Solid–State Circuits Conference, Digest of Techincal Papers, pp. 58 and 59.

*Primary Examiner*—Toan Tran
*Attorney, Agent, or Firm*—Merchant, Gould, Smith, Edell, Welter & Schmidt; Karuna Ojanen

[57] ABSTRACT

A low voltage differential signal detector capable of detecting low-voltage differential signals over a large common-mode voltage range. The signal detector uses two differential pairs of opposite conductivity type, coupled to each other in a self-biasing manner to detect low voltage swings in a signal over a large common-mode voltage range. Depending upon the common-mode voltage level of the signal, the low-voltage level swings will be detected by one of the differential pairs, the other of the differential pairs or both.

19 Claims, 16 Drawing Sheets

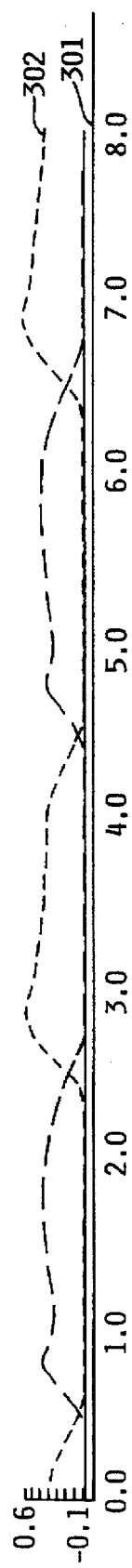
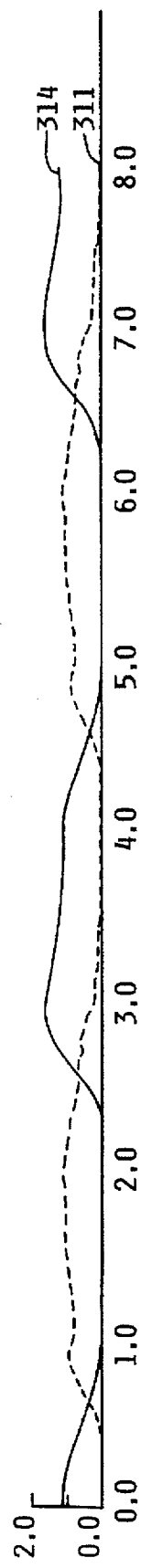
FIGURE 7B
FIGURE 7C

SELF BIASED LOW-VOLTAGE DIFFERENTIAL SIGNAL DETECTOR

BACKGROUND OF THE INVENTION

The present invention is directed to a differential signal detector, and in particular to a differential signal detector capable of detecting low-voltage differential signals over a large common-mode voltage range.

High performance systems requiring low power dissipation have become increasingly important in a number of different applications. These systems require high speed signaling capabilities to achieve the high performance. However, in order to maintain low power dissipation, it is desirable to employ a signaling specifications using low-voltage differential signals. Differential voltage swings at the signal receiver may be between ±100 millivolts (mV) and ±1.8 volts (V). For example, a typical receiver may be required to detect voltage swings on the order of ±400 mV.

Low-voltage differential signal detectors in high performance systems must also be capable of operating over a large common-mode input signal voltage range, for example, 0V to 2.4V. The large common-mode range is required to allow for long cable/interconnect lengths and ground potential difference. It is also desirable to connect devices across a number of different cards requiring higher common-mode voltages as well as a wider operating range of a signal receiver to account for potential noise introduced in the connection media.

FIG. 1 illustrates a conventional differential receiver arrangement. The differential receiver includes a first transistor 10 coupled to a power supply voltage $V_{dd}$ and having a gate coupled to an input voltage $V_{in}$. A differential pair of transistors 11 and 12 are coupled to the transistor 10 and have gates respectively coupled to a reference voltage $V_{ref}$ and the input voltage $V_{in}$. A second pair of transistors 13 and 14 are coupled between the first pair of transistors and ground $V_{ss}$ to mirror the output of the differential pair. An output voltage $V_{out}$ is produced by the circuit. For a more detailed discussion of the circuit depicted in FIG. 1, reference may be made to Gunning, B. et al, "A CMOS Low-Voltage-Swing Transmission-Line Transceiver" presented at 1992 IEEE International Solid-State Circuits Conference, ISSCC 92 Digest of Technical Papers, pp. 58–59.

Only a limited common-mode range of operation is achieved by the circuit illustrated in FIG. 1. In particular, current flow through transistor 10 will be inhibited when the common-mode of the input signal $V_{in}$ reaches a voltage level corresponding to the linear region of transistor 10. Thus, in order to operate properly, the common-mode input voltage $V_{in}$ must follow the relationship:

$$V_{in} \leq V_{dd} - V_{drop}$$

where $V_{drop}$ is equivalent to one gate-source voltage drop of transistors 11 and 12 plus an additional voltage defining the operating region of transistor 10. In general, the value of $V_{drop}$ will depend on the characteristics of the particular components used. However, the common-mode voltage range of operation is significantly less than $V_{dd}$. For a $V_{dd}$ value equal to 2.5 volts, for example, the common-mode range for typical components may be limited to an upper value of approximately 1.3 V.

As described above, a satisfactory low-voltage differential signal detector capable of detecting the required small differential input voltage swings over a large common-mode input range at signaling speeds required for high performance operation has not heretofore been realized.

SUMMARY OF THE INVENTION

Generally, the present invention provides an improved low-voltage differential signal detector.

In one particular embodiment, the present invention is implemented in the form of differential signal detector having a first differential pair of field effect transistors (FETs) of a first conductivity-type and a second differential pair of FETs of a second conductivity-type each having its respective output coupled to a common load. A self-biasing circuit is provided to bias the first and the second differential pairs of FETs, such that the first differential pair of FETs is operative to detect changes in an input signal when a common-mode voltage of the input signal is at a first voltage level, the second differential pair of FETs is operative to detect changes in the input signal when the common-mode voltage is at a second voltage level and both the first and the second differential pairs of FETs are operative to detect changes in the input signal when the common-mode voltage is between the first and second voltage levels.

In another embodiment of the invention, a method of detecting low-voltage differential signals is provided. In accordance with the method, a signal having a variable common-mode input voltage is applied to first and second differential pairs of field effect transistors (FETs). Low-voltage differential signals in the applied signal are detected using substantially only the first differential pair of FETs when the common-mode input voltage of the applied signal is at a first value. When the common-mode input voltage of the applied signal is at a second value, the second differential pair of FETs is substantially used to detect the low-voltage differential signals. When the common-mode input voltage is between the first and second values, both the first and second differential pairs of FETs are used to detect the low-voltage differential signals.

Still another particular embodiment of the present invention is implemented in the form of a system including a differential signal detector for detecting differential signals provided from a function device mounted on a first card driving the signals with a driver. The signal detector resides on a separate card and is made up of two differential pairs of field effect transistor of different conductivity type. The two pairs operate such that the first pair detects changes in a logic signal provided from the driver to the detector when a common-mode voltage of the logic signal is high while the second pair detects changes in the logic signals when the common-mode voltage is low. When the common-mode is between the high and low value both pairs cooperatively detect changes in the logic signals The above summary of the present invention is not intended to present each embodiment or every aspect of the present invention. This is the purpose of the figures and the associated description which follow.

BRIEF DESCRIPTION OF THE DRAWINGS

The invention may be more completely understood in consideration of the following detailed description of various embodiments of the invention in connection with the accompanying drawings, in which:

FIGS. 7A–7G illustrate relative changes in voltage and current of an embodiment of a device depicted in FIG. 3.

DETAILED DESCRIPTION OF PREFERRED EMBODIMENTS

The detailed description of the invention below is made with reference to various embodiments. It is not intended to limit the invention to the described embodiments. Rather, the described embodiments are provided to provide an understanding of the various features of the invention. Numerous other embodiments are envisioned as being within the scope of the invention.

In accordance with an embodiment of the invention, an improved low-voltage differential signal detector is provided. In an exemplary embodiment, the detector may be implemented using standard semiconductor devices such as, for example, CMOS (complimentary metal oxide semiconductor) devices. Such a design facilitates manufacture of a system using the low-voltage differential signal detector and reduces overhead and manufacturing costs. As described below, the low-voltage differential signal detector can be implemented as a self-biased common-mode compensated differential receiver (hereinafter "the differential receiver"). The differential receiver is capable of operating over a large common-mode input voltage range to detect the low-voltage differential signals. The upper limit of the common-mode voltage range over which the differential receiver may operate is only limited by the power supply voltage $V_{dd}$. In general the differential receiver may operate over a common-mode voltage range from ground to a just below the power supply voltage $V_{dd}$, for example, by a few millivolts. If the power supply voltage $V_{dd}$ is 5 volts, for example, the differential detector may operate over a common-mode voltage range from 0 V to approximately 4.9 V.

Figure 1:
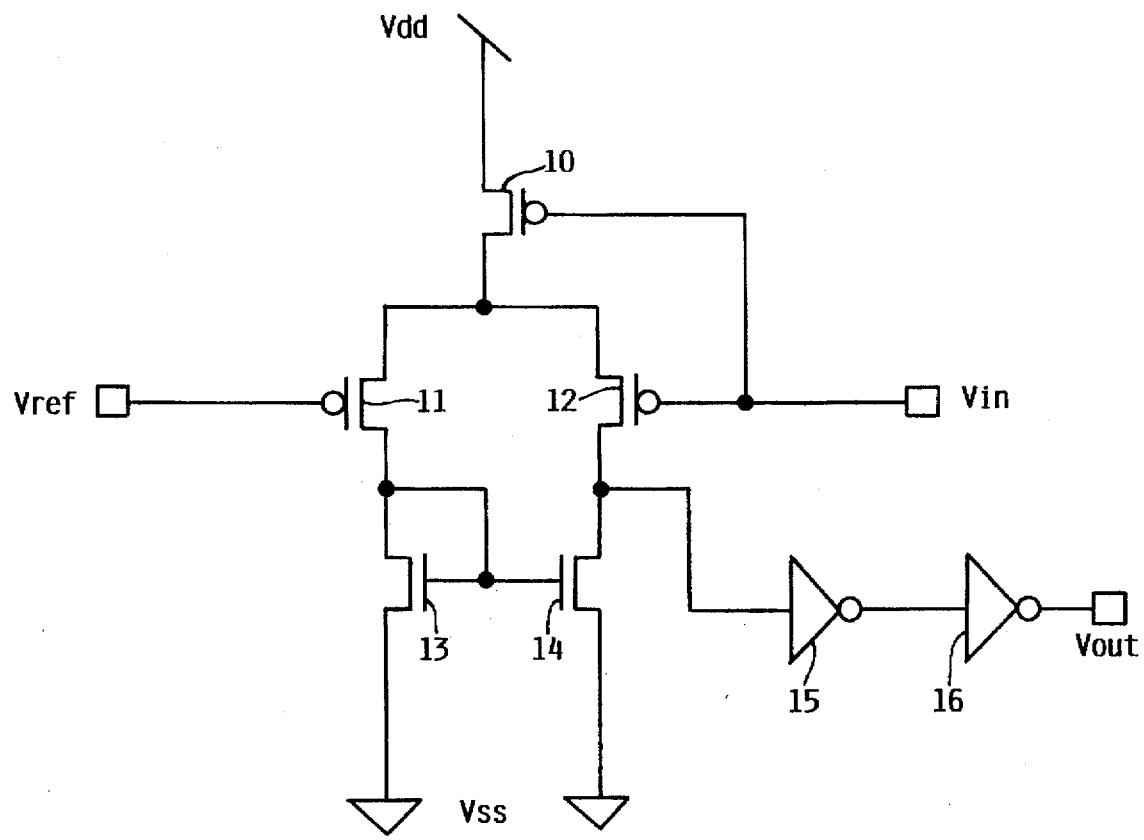
FIG. 1 illustrates a conventional differential receiver arrangement.
Figure 2A:
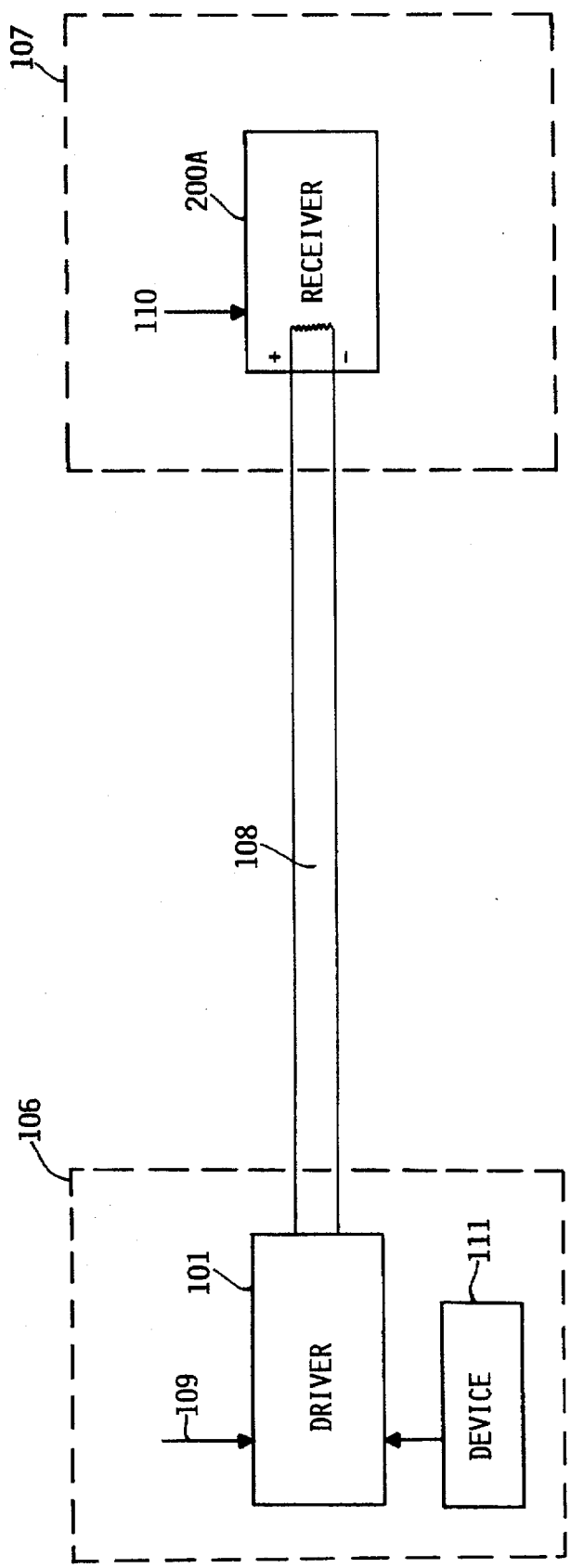
FIGS. 2A–2C illustrate various embodiments of the invention.
Figure 2B:
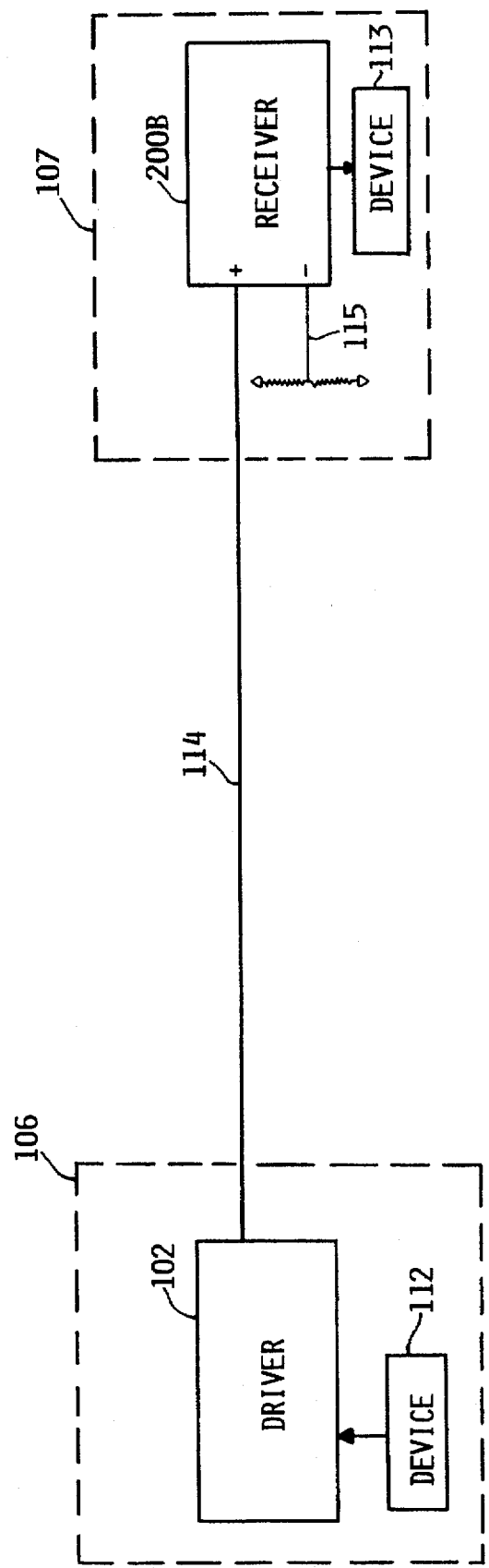
Figure 2C:
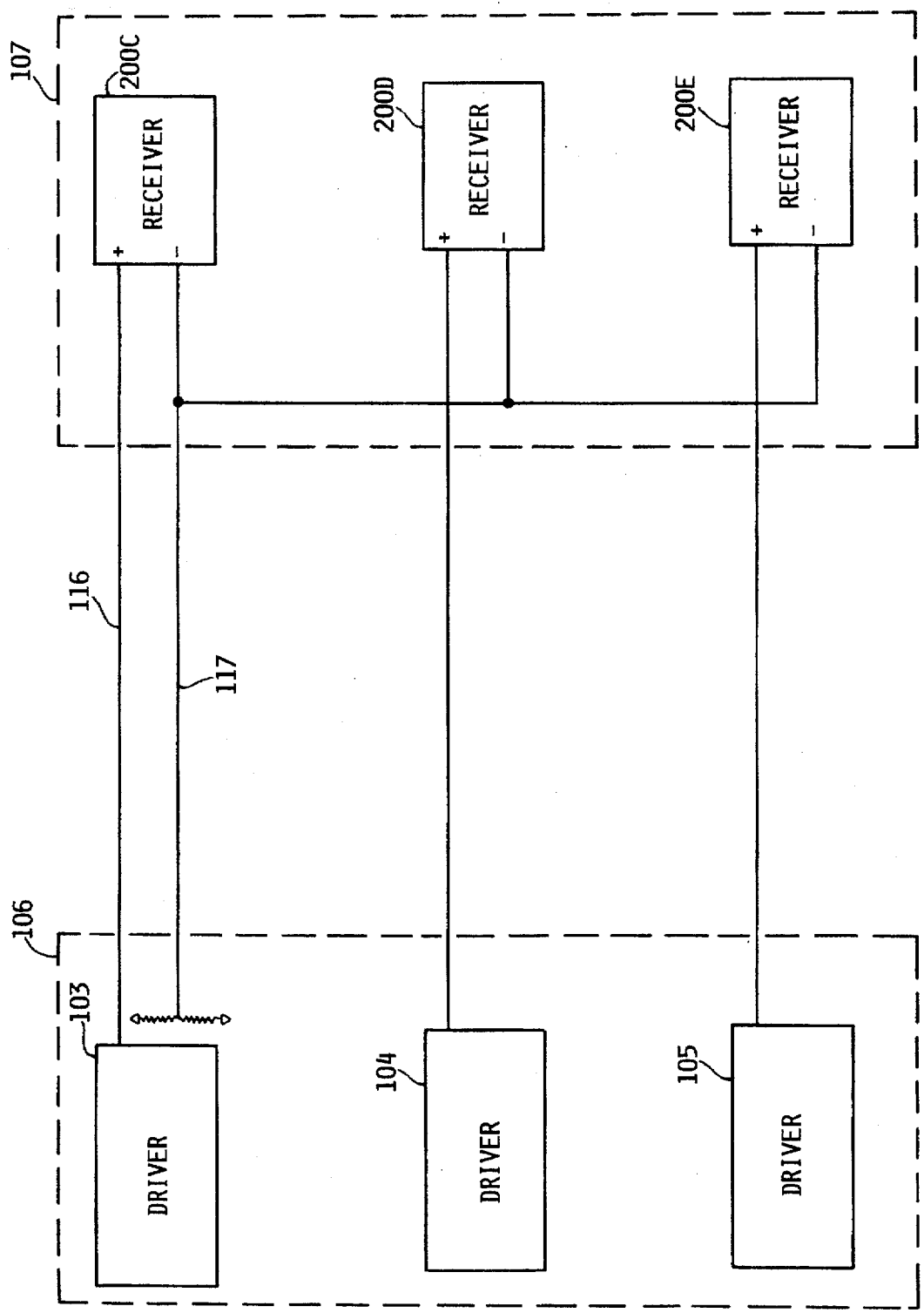

In FIGS. 2A–2C, exemplary systems employing the differential receiver are illustrated. In FIG. 2A a driver 101 is connected to a differential receiver 200A. The driver 101 resides on a chip which is mounted in or on a module residing on an a first card 106. The differential receiver 200A also resides on a chip which mounted in or on a separate module which may reside on a separate card 107. The module in or on which the driver 101 is mounted includes a device 111 which uses the driver 101 to drive signals to the differential receiver 200A. The device 111 may be any of number of conventional devices such as a processor, storage controller, microprocessor chip and the like which use such drivers. The driver 101 and differential receiver 200A may also use separate power supplies 109 and 110, respectively, of 2.4, 3.3 or 5.0 V, for example.

The driver 101 is connected to the differential receiver 200A using a connection media 108 provided between cards 106 and 107. The connection media 108 may be a card, board or cable and the appropriate connectors. If cables are used, the length could be on the order of 10 to 100 meters. If a card or board is used, the length of the media 108 is on the order of 10 to 40 inches. The length of the connection media 108 depends on the frequency of the signal sent form the driver 101 to the differential receiver 200A.

In transferring signals from the driver 101 to the differential receiver 200A, various influence may cause the common-mode of the signal to change. Variations of the power supply of the driver 101 and the power supply of the differential receiver 200A, ground bounce and noise in the power supply, may all influence the common-mode voltage level of the signal received by the differential receiver 200A. Noise may also be introduced into the signal from the card 106, card 107 and/or the connection media 108. The differential receiver 200A maintains its signal detection sensitivity despite such changes in the common-mode voltage level. The wide common-mode input voltage range of the differential receiver 200A allows the common-mode input to vary, due to noise and the like, while still providing an accurate translation of the low-voltage logic signals from the driver 101 provided to the input of the differential receiver 200A to a CMOS logic signal at its output. The differential receiver 200A is also connected to devices on its module (not shown) which use the detected signal.

In FIG. 2B another embodiment of a system using a differential receiver is illustrated. A driver 102 has an output connected via connection media 114 to a positive input of the differential receiver 200B. As in FIG. 2A, the driver 102 and the differential receiver 200B respectively reside on different cards 106 and 107 and are connected to respective devices 112 and 113. In this embodiment, the driver 102 may be, for example, a TTL (transistor-transistor logic) or CMOS logic single ended signal driving the positive input of the differential receiver 200B. The negative input of the differential receiver 200B is tied to a reference voltage along line 115.

In FIG. 2C still another exemplary embodiment using an differential receiver is illustrated. A first driver 103 driving low level logic signals is connected along connection media 116 to drive the positive input of the differential receiver 200C. The negative input of the differential receiver 200C is tied to a reference voltage generated on the card 106 containing the driver 103.

A number of drivers 103, 104 and 105 are illustrated respectively connected to differential receivers 200C, 200D and 200E. As illustrated in FIG. 2C, a common reference voltage can be applied to each of the differential receivers 200C, 200D and 200E, thus requiring only a single connection media, such as a cable, between cards 106 and 107 for the reference voltage.

Figure 3:
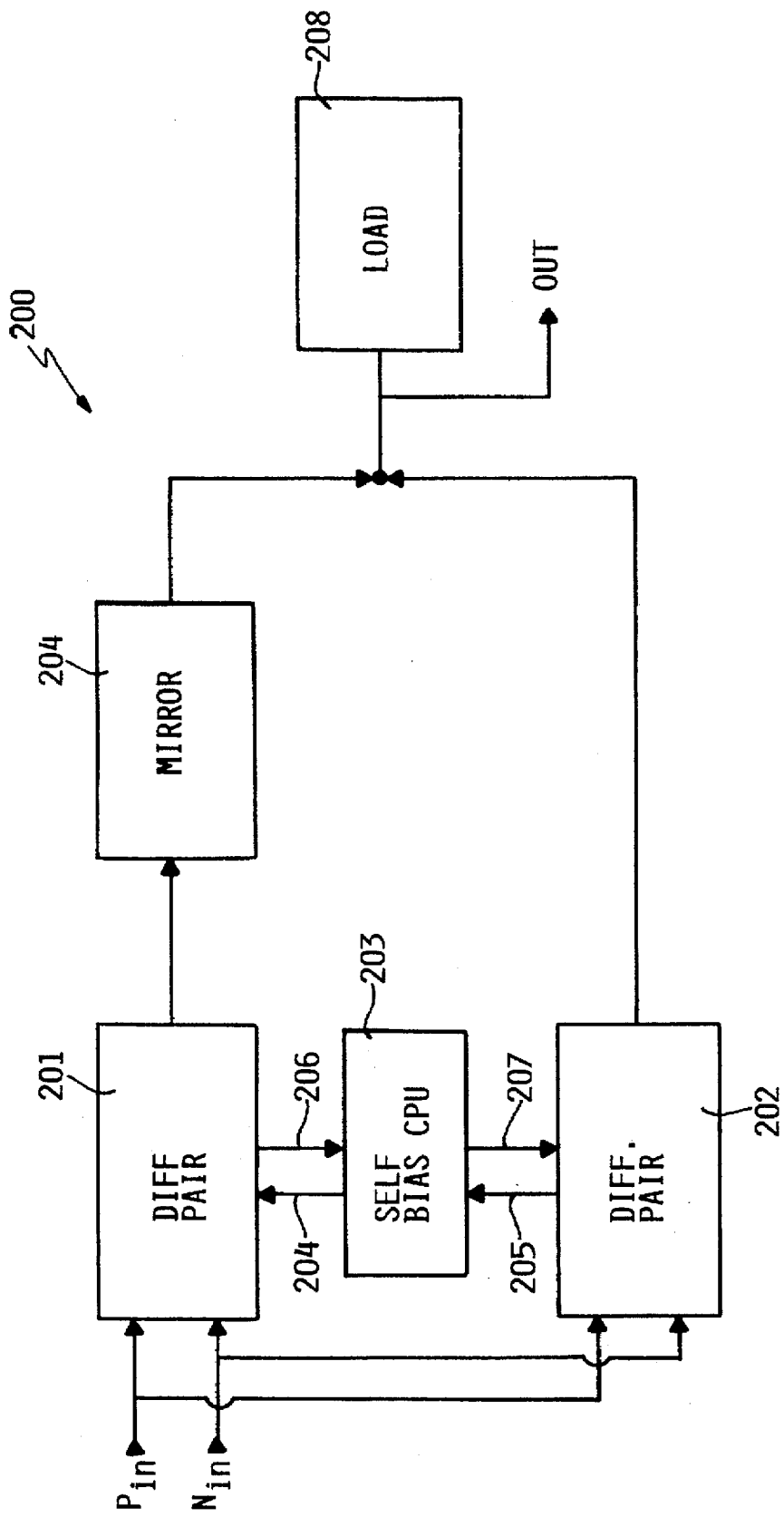
FIG. 3 illustrates an embodiment of a low-voltage differential signal detector in accordance with an embodiment of the invention.

In FIG. 3, a block diagram of an low-voltage differential signal detector in accordance with an exemplary embodiment of the invention is illustrated. A positive input signal $P_{in}$ and a negative input signal $N_{in}$ are provided to each of two differential pairs of field effect transistors (FETs) 201 and 202. The two input signals $P_{in}$ and $N_{in}$ operate over a relatively large common-mode input voltage range. The two differential pairs are of opposite conductivity type, for example, P-type and N-type respectively, and are used to detect voltages swings for different common-mode voltages. Connected between the two differential pairs is a self-biasing circuit 203.

The self-biasing circuit 203 controls the bias of the differential pair 201 with a first bias control signal 204 in response to a bias signal 205 received from the differential pair 202. The bias of the differential pair 202 is controlled via a second bias control signal 207 in response to a bias signal 206 received from the differential pair 201.

The output of the differential pair 201 is provided to a mirror circuit 204. As described more fully below, the mirror circuit 204 compensates for opposite polarities of the outputs from the two differential pairs 201 and 202. The output from the mirror device 204 is coupled with the output from the differential pair 202 and the combined output is connected to a common load 208.

In operation, the differential pair 201 is used in a substantially exclusive manner to detect the low-voltage swings at one end of the common-mode voltage range, for example, at low voltages, and the differential pair 202 is used in a substantially exclusive manner to detect the low-voltage swings at the other end of the common-mode voltage range, for example, at high voltages. When the common-mode voltage lies between the two extremes, both of the differential pairs 201 and 202 are used in varying degrees to detect the low-voltage swings. The amount a particular differential pair contributes to the combined output depends on the magnitude of the common-mode voltage which influences the bias control of the respective differential pairs. It will be appreciated that even at the extremes of common voltage both differential pairs 201 and 202 may contribute to the output. However, the contribution of one the pair at the extremes will be typically negligible such that only one of the pairs is effectively used to detect low-voltage swings.

Figure 4:
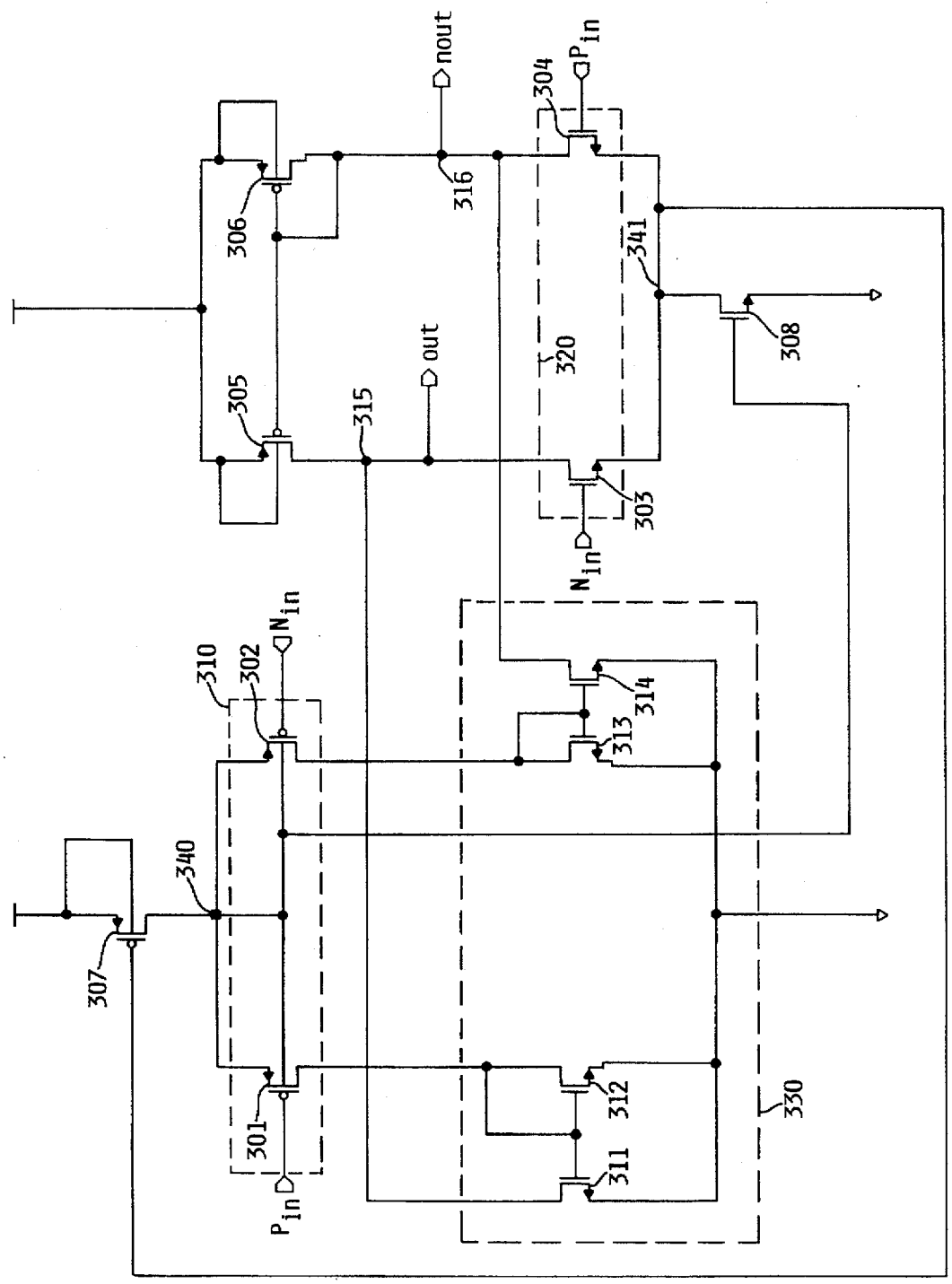
FIG. 4 illustrates a detailed circuit of an embodiment of the invention.

A more detailed exemplary embodiment of the circuit depicted in FIG. 3 is illustrated in FIG. 4. In FIG. 4, a first pair of P-type FETs (PFETs) 301 and 302 form a PFET differential pair 310. An NFET differential pair 320 is formed of N-type FETs (NFETs) 303 and 304. Both the PFETs 301 and 302 and the NFETs 303 and 304 drive a common load made up of PFETs 305 and 306.

In the illustrated embodiment the NFET differential pair 320 is permitted to switch in accordance with the low-voltage swings when the common-mode input voltage is high and the PFET differential pair 310 is permitted to switch when the common-mode input voltage is low. When the common-mode is between the two extremes both the NFET differential pair 320 and the PFET differential pair 310 are active to detect switching and produce the output signals OUT and NOUT. The output of the two differential pairs 310 and 320 are tied together at points 315 and 316 and are connected to the common load devices 305 and 306, respectively. The differential pairs 310 and 320 are biased with tail currents provided by PFET 307 and NFET 308, respectively.

As can be appreciated from FIG. 4, as the common-mode input voltage increases, the node voltages at node 341 and node 340 also increase. This causes the current in the NFET 308 bias device, which biases the NFET differential pair 320, to increase and the current in the PFET 307, which biases the PFET differential pair 310, to decrease. Thus, the output signals OUT and NOUT become more influenced by the NFET differential pair 320 and less by the PFET differential pair 310. When the common-mode voltage level decreases, the PFET differential pair 310 is biased with a higher current as the current in PFET 307 increases and the NFET differential pair 320 is biased with less current as the current in NFET 308 decreases. In this manner, the contribution of the PFET differential pair 310 and the NFET differential pair 320 to the output signal are respectively increased and decreased.

In the circuit of FIG. 4, the sum of the differential bias currents in PFET 307 and NFET 308 remains substantially constant. Thus, a near constant current is delivered to the common load devices 305 and 306 regardless of the input common-mode voltage level. This significantly reduces variance in receiver delay resulting from changes in the input common-mode voltage level. The above described low-voltage differential signal detector circuit operates at reasonable switching speeds and with a sensitivity to low-voltage differential input signals over a relative large common-mode input voltage range.

The circuit described above operates as two differential pairs that steer the bias of tail currents in PFET 307 and NFET 308 to the load. The output current from the PFET differential pair 310 is mirrored via mirror circuit 330 formed of NFET devices 311, 312, 313 and 314 connected between the PFET differential pair 310 and the common load devices 305 and 306. The mirrored output is combined with the output of the NFET differential pair 320 at points 315 and 316. In this manner, the output signals OUT and NOUT are referenced to the $V_{dd}$ power supply regardless of which differential pair is driving the most current or biased with the highest tail current. Thus, the output voltages are relatively constant.

The mirror circuit 330 is provided to change the polarity of the output from the PFET differential pair 310. When the $P_{in}$ signal is low, the $N_{in}$ signal is positive. In this case, as the circuit attempts to drive the OUT signal to a low value. The PFET differential pair 310 should be operating. However, the NFET 303 may be applying some drive to load 305, thereby inhibiting the ability of the PFET differential pair to drive the OUT signal all the way to a logical low output. The mirror circuit changes current polarity so that both differential pairs 310 and 320 of the circuit operate to switch the OUT and NOUT nodes in the appropriate direction.

It should be understood that the described embodiment of FIG. 4 is provided by way of example and not limitation. Variations to the circuit should be apparent. For example, the circuit topology depicted in FIG. 4, could be inverted to provide NFET common load devices with an output signal referenced to ground.

The operation of the circuit depicted in FIG. 4 will be better understood from the following example with reference to FIGS. 5–7 which illustrate various current and voltage values as the common-mode input voltage changes. In the examples of FIGS. 5–7, a power supply voltage $V_{dd}$ of 3.3 V is used. It should be understood, however, that the described embodiment could be used with a wide range of power supplies. In the illustrated examples, the DC bias of the various nodes are shown as the common-mode input voltage varies. The $P_{in}$ and $N_{in}$ common-mode input voltages can range from 0.0 V to 3.3 V. The differential voltage swing between the two pins $P_{in}$ and $N_{in}$ is 0.4 V. For example, the $P_{in}$ and $N_{in}$ may be biased at 0.8 V for a low level and 1.2 V for a high level.

As described above, the input common-mode level of $P_{in}$ and $N_{in}$ control voltages at nodes 340 and 341. The bias of node 340 is one gate-source voltage drop of PFETs 301 and 302 above $P_{in}$ and $N_{in}$. The bias of node 341 is one gate source voltage drop of NFETs 303 and 304 below $P_{in}$ and $N_{in}$. FIGS. 5A–5D illustrate the changes which occur as the common-mode input voltage $N_{in}$ varies from 0.0 V to 3.3 V. The scale on the left side of each graph represents either voltage in volts or current in milliamps (mA). For example, in FIG. 5A trace 401 represents the change in voltage of the $N_{in}$ signal on line 401. Traces 402 and 403 illustrates the corresponding change in current in NFET 308 and PFET 307 respectively, as the voltage varies. The changes in voltage at nodes 340 and 341 are illustrated along lines 404 and 405 of FIG. 5B, respectively.

Figure 5A:
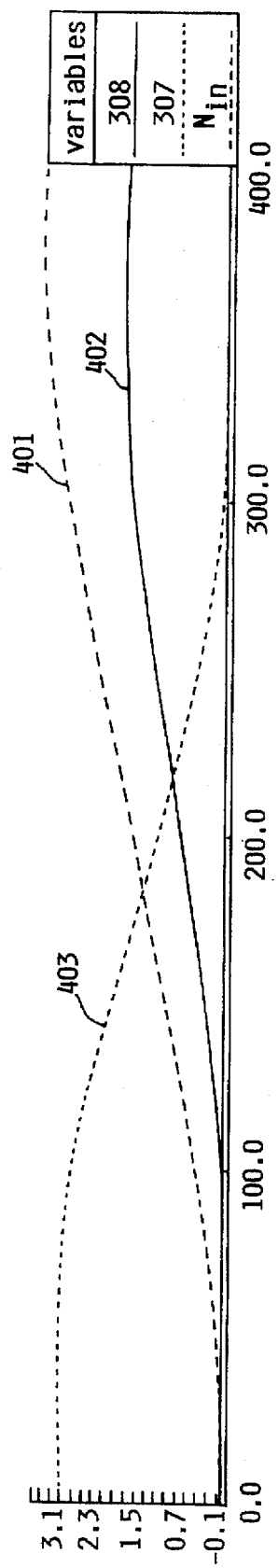
FIGS. 5A–5D illustrate relative changes in voltage and current of an embodiment of a device depicted in FIG. 3.
Figure 5B:
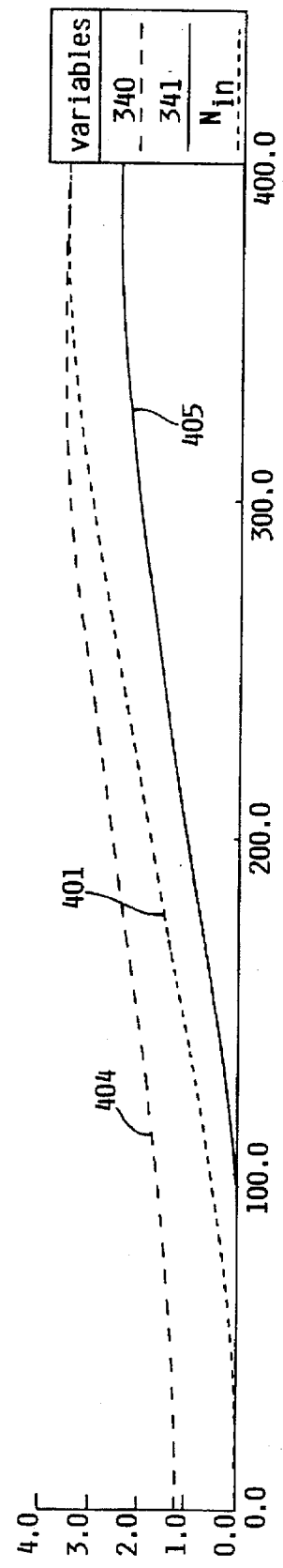
Figure 5C:
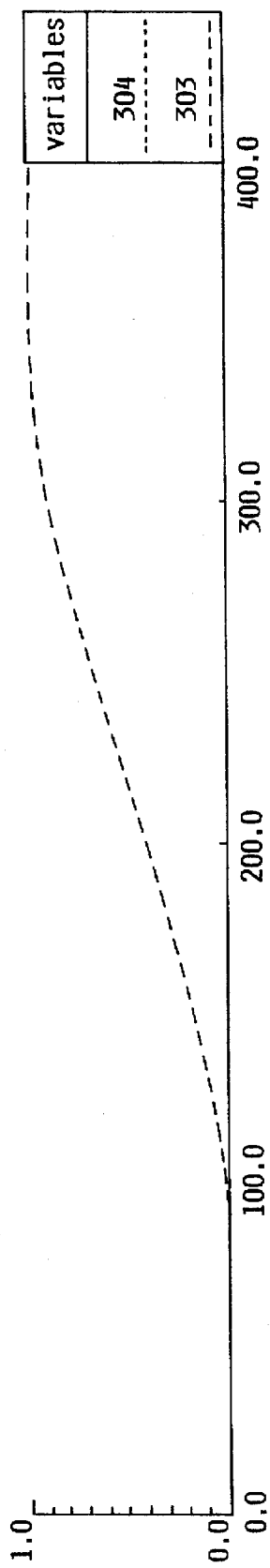
Figure 5D:
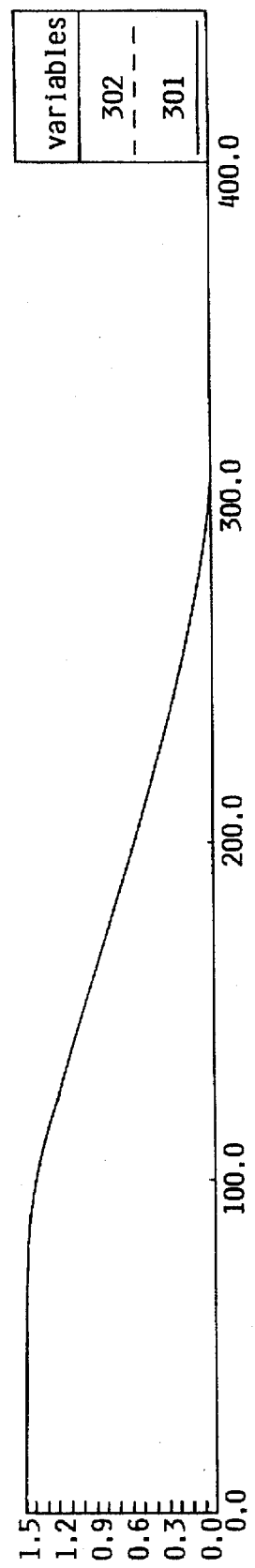

As can be seen in FIGS. 5A–5B, as the voltage of $N_{in}$ changes from 0.0 V to 3.3 V the voltage at node 341 changes from 0.0 to 2.5 V and the voltage at node 340 changes from 1.2 to 3.3 V as illustrated by line 404. This causes a change in the current in NFET 308 from 0.0 to 2.0 mA and the current in PFET 307 from 3.1 to 0.0 mA. It is noted that PFET 307 (FIG. 4) supplies current to the devices of the first differential pair 310 and the current mirror 330. In this case, as the current in PFET 307 changes from 3.1 to 0.0 mA the current in NFET devices 312 and 313 changes from 1.5 to 0.0 mA while the current in NFET devices 311 and 314 changes from 3.6 to 0.0 mA. The current in NFET devices 311 and 314 are mirrored and summed by the current mirror formed by the PFET devices of the common load and are fed to the output nodes OUT and NOUT, respectively, such that the current in these devices varies from 3.6 to 1.0 mA.

In FIGS. 5A–5G and 6A–6G the operation of the circuit is illustrated with common-mode input voltages of 1.0 V and 2.4 V, respectively. In each case the $P_{in}$ and $N_{in}$ input voltages are swinging 0.4 V with respect to each other.

Figure 6A:
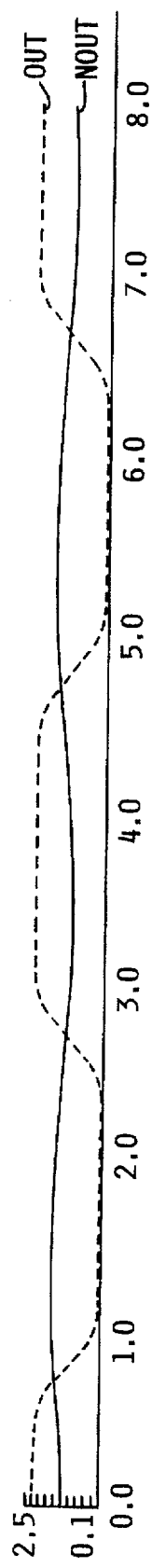
FIGS. 6A–6G illustrate relative changes in voltage and current of an embodiment of a device depicted in FIG. 3.
Figure 6B:
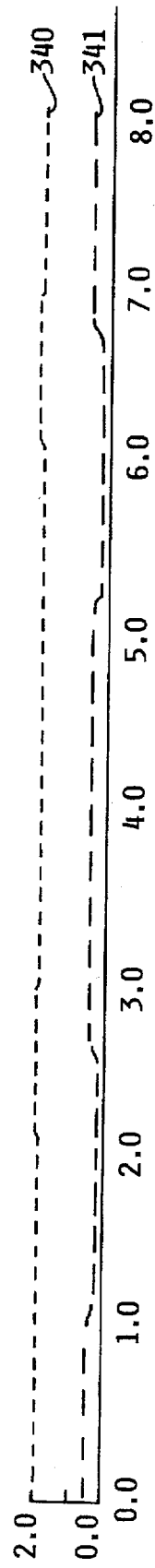
Figure 6C:
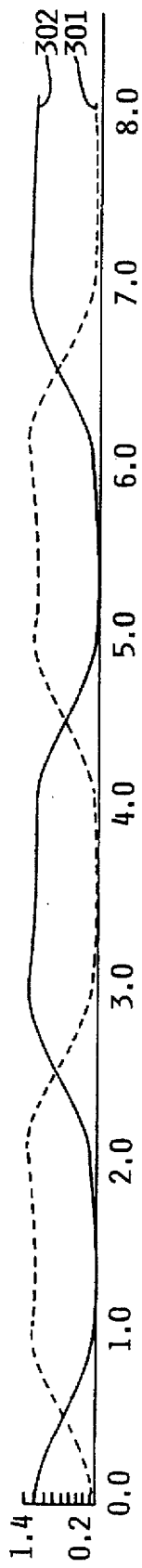
Figure 6D:
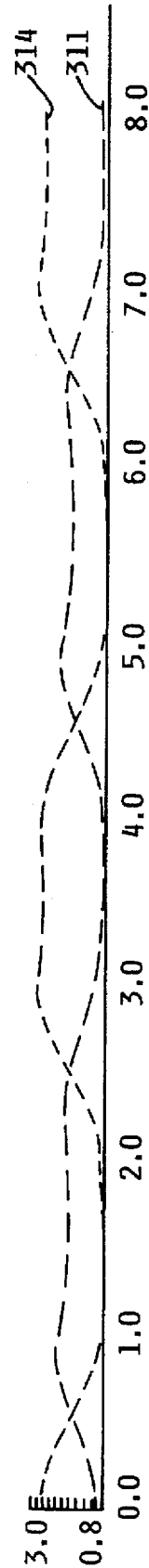
Figure 6E:
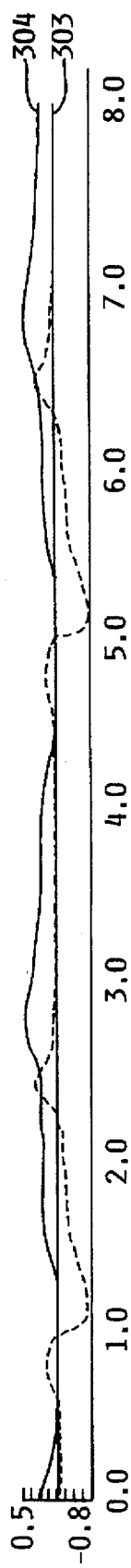
Figure 6F:
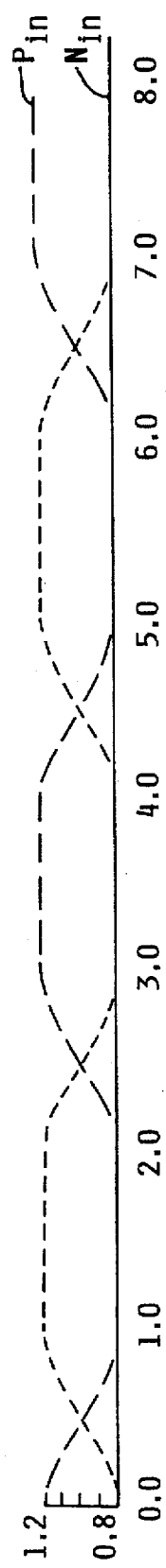
Figure 6G:
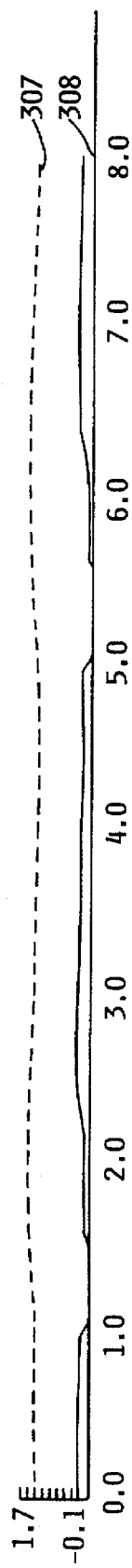

As illustrated in FIG. 6F, $P_{in}$ and $N_{in}$ alternate between 0.8 V and 1.2 V. Node 340 is biased at 1.8 volts and node 341 is biased at 0.45 volts as illustrated in FIG. 6B. The current in the PFETs 301 and 302 of differential pair 310 (FIG. 4) changes between 1.5 mA and 0.3 mA as illustrated in FIG. 6C. In this case, the current in NFETs 303, 304 and 308 are negligible and do not contribute to the switching of NOUT due to the voltage on nodes 340 and 341 as illustrated in FIGS. 6E and 6G. As illustrated in FIG. 6A, the output signal OUT changes between 2.5 and 0.2 V.

Figure 7A:
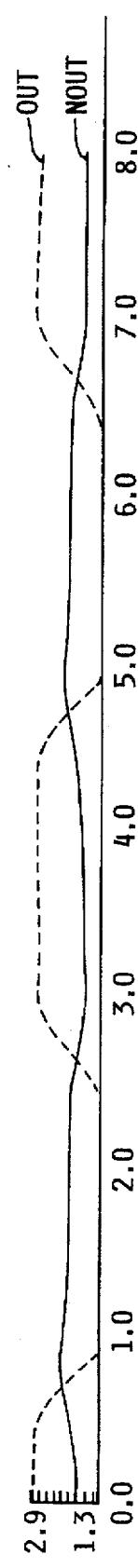
Figure 7D:
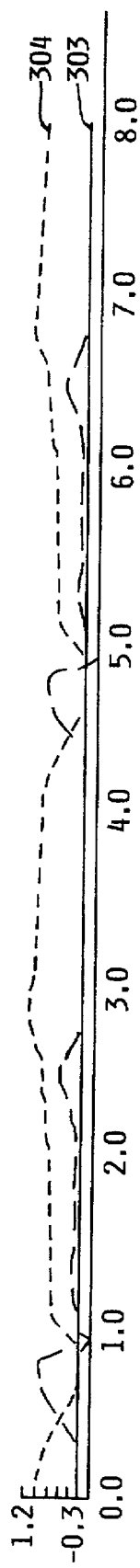
Figure 7E:
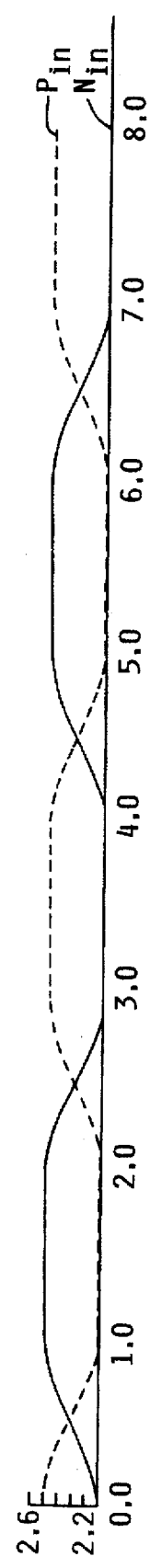
Figure 7F:
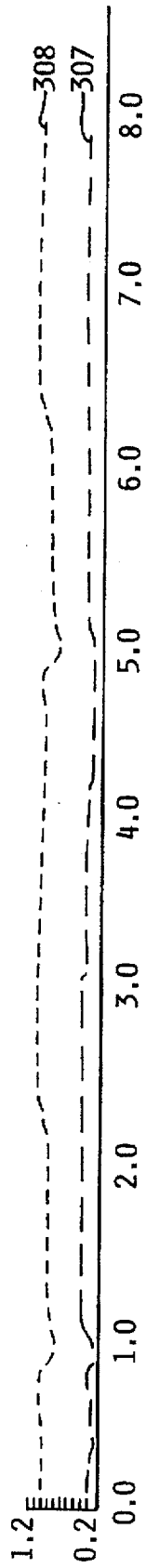
Figure 7G:
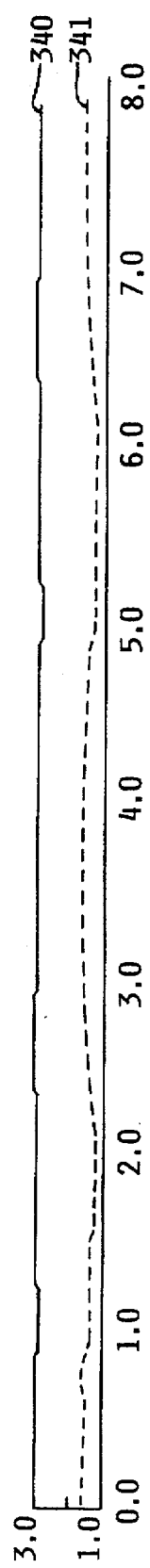

In FIG. 7E, $P_{in}$ and $N_{in}$ alternate between 2.0 V and 2.4 V. Node 340 is biased at 2.9 V and node 341 is bias to 1.3 V as illustrated in FIG. 7G. The current is switching between 1.2 mA and 0.0 mA in NFET devices 303 and 304. In this case the currents in PFET devices 301, 302 and 307 are negligible due to the voltage on nodes 340 and 341 and do not contribute significantly to switching of the circuit. As illustrated in FIG. 7A, the output signal OUT changes between 2.9 and 1.3 V.

Figure 8:
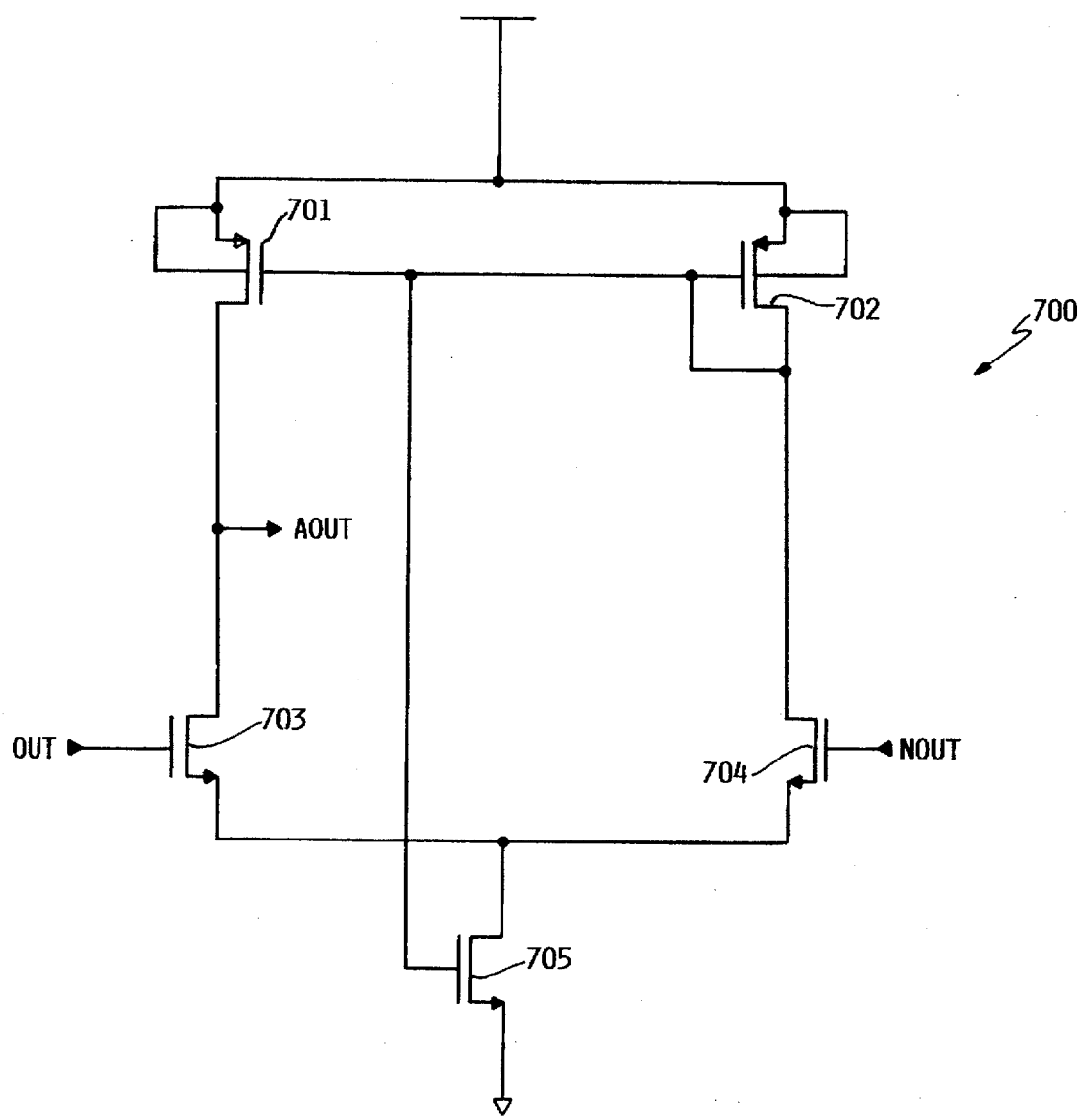
FIG. 8 illustrates an additional component of an embodiment of the invention.

The output signals OUT and NOUT can be supplied to a second stage NFET differential pair amplifier 700 as illustrated in FIG. 8. This second stage NFET differential pair amplifier 700 includes common load PFET devices 701 and 702 and NFET differential pair devices 703 and 704. The control gates of the differential pair devices 703 and 704, respectively, receive the OUT signal and NOUT signal from the circuit depicted in FIG. 4, for example. The bias is controlled by the NFET device 705.

The circuit in FIG. 8 provides additional gain to the output signals OUT and NOUT and converts the signals into a single ended output signal AOUT which can then be buffered with a traditional CMOS invertor (not shown) to assure full CMOS output swings. In this manner a constant delay over the common-mode input variation is obtained.

While the present invention has been described in connection with the exemplary embodiments thereof, it will be understood that many modifications will be readily apparent to those skilled in the art, and this application is intended to cover any adaptations or variations thereof. It is manifestly intended that this invention be limited only by the full fair scope of the claims appended below.

What is claimed is:

1. A differential signal detecting circuit operable over a large common-mode voltage range to detect low-voltage differential changes of an input signal carrying information in the form of the low-voltage differential changes, the differential signal detecting circuit comprising:

a first differential pair of field effect transistors (FETs) of a first conductivity type coupled to receive the input signal and having an output coupled to a common load; and a second differential pair of FETs of a second conductivity type coupled to receive the input signal and having an output coupled to the common load, wherein the first differential pair of FETs is operative to detect the low-voltage differential changes in the input signal when the common-mode voltage is at a first voltage level, the second differential pair of FETs is operative to detect the low-voltage differential changes in the input signal when the common-mode voltage is at a second voltage level and both the first and the second differential pairs of FETs are operative to detect the low-voltage differential changes in the input signal when the common-mode voltage is between the first and second voltage levels, and wherein the detected low-voltage differential changes are output to the common load as the information carried by the input signal; and a self-biasing circuit to bias and cross-couple the first and second differential pair of field effect transistors in response to each other.

2. A circuit as recited in claim 1, the self-biasing circuit comprising:

a first bias FET of the first conductivity type coupled to control biasing of the first differential pair of FETs and having a control gate responsive to the second pair of differential FETs; and a second bias FET of the second conductivity type coupled to control biasing of the second differential pair of FETs and having a control gate responsive to the first differential pair of FETs.

3. A circuit as recited in claim 1, further comprising a mirror circuit of the second conductivity type coupling the output from the first differential pair of FETs to the common load such that the output provided to the common load from the first differential pair of FETs is of a same polarity as the output provided to the common load from the second differential pair of FETs.

4. A circuit as recited in claim 1, wherein the first differential pair of FETs comprise N-type conductivity FETs and the second differential pair of FETs comprise P-type conductivity FETs.

5. A circuit as recited in claim 1, wherein the first voltage level is 0 Volts (V) and the second voltage level is 2.4 V.

6. A circuit as recited in claim 5, wherein the changes detected in the input signal are voltage swings of about ±100 millivolts to ±1.8 V.

7. A circuit as recited in claim 1, further comprising an amplifier circuit coupled to the first and second differential pairs of FETs to amplify an output from the first and second differential pairs of FETs, the output representing changes detected by the first and second differential pairs of FETs.

8. A circuit as recited in claim 7, wherein the amplifier circuit comprises a third differential pair of FETs of said second conductivity type, said third differential pair of FETs converting the output from the first and second differential pairs of FETs to a single ended output signal.

9. A method of detecting low-voltage differential input signals of a common-mode input voltage ranging from a first value to a second value, the low-voltage differential signals representing information carried by the input signal, the method comprising the steps of:

(a) applying the input signal having a common-mode input voltage to first and second differential pairs of field effect transistors (FETs);

(b) detecting the low-voltage differential signals in the applied signal by using substantially only the first differential pair of FETs when the common-mode input voltage of the applied signal is said first value;

(c) detecting the low-voltage differential signals in the applied signal by using substantially only the second differential pair of FETs when the common-mode input voltage of the applied signal is said second value;

(d) detecting low-voltage differential signals in the applied signal by using both the first and second differential pairs of FETs when the common-mode input voltage of the applied signal is between the first and the second values; and (e) outputting a relatively high-voltage differential signal representative of the information carried by the input signal based on the detected low-voltage differential signals;

(f) biasing the first differential pair of FETs with a current responsive to the second differential pair of FETs; and (g) biasing the second differential pair of FETs with a current responsive to the first differential pair of FETs.

10. A differential signal detecting circuit operable over a large common-mode voltage range of an input signal to detect low-voltage differential changes in the input signal, comprising:

a first differential pair of field effect transistors (FETs) of a first conductivity type coupled to receive the input signal and having an output coupled to a common load;

a second differential pair of FETs of a second conductivity type coupled to receive the input signal and having an output coupled to the common load;

a first bias FET of the first conductivity type having a control gate responsive to the second pair of differential FETs to control biasing of the first differential pair of FETs; and a second bias FET of the second conductivity type having a control gate responsive to the first differential pair of FETs to control biasing of the second differential pair of FETs, wherein the first differential pair of FETs is operative to detect the low-voltage differential changes in an input signal when the common-mode voltage is at a first voltage level, the second differential pair of FETs is operative to detect changes in the input signal when the common-mode voltage is at a second voltage level, and both the first and the second differential pairs of FETs are operative to detect changes in the input signal when the common-mode voltage is between the first and second voltage levels.

11. A method as recited in claim 9, further comprising the step of providing an output from each of the first and second differential pairs of FETs to a common load.

12. A method as recited in claim 11, wherein the first differential pair of FETs is of a first conductivity type and the second differential pair of FETs is of the second conductivity type.

13. A method as recited in claim 12, further comprising the step of mirroring an output from one of the first and second differential pairs of FETs, prior to providing the output from the one of the first and second differential pairs of FETs to the common load, with a mirror circuit having a conductivity type of the other of the first and second differential pairs of FETs.

14. A system comprising:

a functional device mounted on a first card;

a differential signal detector, mounted on a second card, the differential signal detector including a first differential pair of field effect transistors (FETs) of a first conductivity type having its output coupled to a common load, a second differential pair of FETs of a second conductivity type having its output coupled to the common load, and a self-biasing circuit, cross-coupled between the first and the second differential pairs of FETs, the self-biasing circuit controlling bias currents supplied to the first and the second differential pairs of FETs in response to each other; and a driver coupled to the functional device mounted on said first card, the driver being coupled to the differential signal detector to drive low-voltage differential logic signals to the differential signal detector, wherein the first differential pair of FETs of the differential signal detector is effectively used to detect changes in the logic signals when a common-mode voltage of the logic signals is at a first voltage level, the second differential pair of FETs is effectively used to detect changes in the logic signals when the common-mode voltage of the logic signals is at a second voltage level and both the first and the second differential pairs of FETs cooperatively detect changes in the logic signals when the common-mode voltage of the logic signals is between the first and second voltage levels.

15. A system as recited in claim 14, wherein the driver is connected to the differential signal detector via a third card, and wherein the third card influence the common-mode voltage of the logic signal.

16. A system as recited in claim 14, wherein the driver is connected to the differential signal detector via a cable having a length between 10 and 100 meters.

17. A system as recited in claim 14, wherein the functional device is a microprocessor.

18. A system as recited in claim 14, wherein the self-biasing circuit comprises:

a first bias FET of the first conductivity type coupled to control biasing of the first differential pair of FETs and having a control gate coupled to the second differential pair of FETs; and a second bias FET of the second conductivity type coupled to control biasing of the second differential pair of FETs and having a control gate coupled to the first differential pair of FETs.

19. A system as recited in claim 18, wherein the differential signal detector further comprises a mirror circuit of the second conductivity type coupling the output from the first differential pair of FETs to the common load such that the output provided to the common load from the first differential pair of FETs is of a same polarity as the output provided to the common load from the second differential pair of FETs.

* * * * *